(12) United States Patent
Ogawa

(10) Patent No.: US 11,757,079 B2
(45) Date of Patent: Sep. 12, 2023

(54) DISPLAY DEVICE

(71) Applicant: Japan Display Inc., Tokyo (JP)

(72) Inventor: Akihiro Ogawa, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 171 days.

(21) Appl. No.: 17/165,974

(22) Filed: Feb. 3, 2021

(65) Prior Publication Data

US 2021/0265542 A1    Aug. 26, 2021

(30) Foreign Application Priority Data

Feb. 25, 2020    (JP) .................................. 2020-029415

(51) Int. Cl.
*H01L 33/62*    (2010.01)
*H01L 27/12*    (2006.01)
*H01L 25/075*   (2006.01)

(52) U.S. Cl.
CPC .......... *H01L 33/62* (2013.01); *H01L 25/0753* (2013.01); *H01L 27/1214* (2013.01)

(58) Field of Classification Search
CPC . H01L 33/62; H01L 25/0753; H01L 27/1214; H01L 27/1225; H01L 25/167
See application file for complete search history.

(56) References Cited

U.S. PATENT DOCUMENTS

| | | | |
|---|---|---|---|
| 10,090,335 B2 | 10/2018 | Kang et al. | |
| 2003/0116768 A1* | 6/2003 | Ishikawa | H01L 27/124 257/E27.113 |
| 2014/0209931 A1* | 7/2014 | Liao | H01L 25/0753 438/27 |
| 2015/0340641 A1* | 11/2015 | Kuroki | H10K 85/656 257/40 |
| 2016/0365406 A1 | 12/2016 | Adachi et al. | |
| 2017/0077204 A1* | 3/2017 | Li | H10K 59/176 |
| 2020/0043400 A1* | 2/2020 | Chen | G09G 3/22 |
| 2021/0126040 A1* | 4/2021 | Moriwaki | H04N 25/772 |
| 2022/0406760 A1* | 12/2022 | Ogawa | H01L 33/42 |

FOREIGN PATENT DOCUMENTS

JP    2017-3849 A    1/2017

* cited by examiner

*Primary Examiner* — Victor A Mandala
(74) *Attorney, Agent, or Firm* — XSENSUS LLP

(57) ABSTRACT

A display device includes a circuit substrate comprising a first electrode pad and an LED chip comprising a first electrode bump that is electrically connected to the first electrode pad, and at least emitting light in a direction of the circuit substrate. The first electrode pad comprises a first light transmission region that transmits light emitted from the LED chip.

13 Claims, 13 Drawing Sheets

DISPLAY DEVICE

CROSS REFERENCE TO RELATED APPLICATION

This application is based on and claims the benefit of priority from the prior Japanese Patent Application No. 2020-029415, filed on Feb. 25, 2020, the entire contents of which are incorporated herein by reference.

FIELD

An embodiment of the present invention relates to a display device, particularly a display device using LED chips.

BACKGROUND

For a small-sized or medium-sized display such as a smartphone, a display device using a liquid crystal or an OLED (Organic Light Emitting Diode) has already been commercialized. In particular, an OLED display device using the OLED that is a self-luminous element has advantages that it has high contrast and does not require a backlight, as compared with a liquid crystal display device. By using transparent conductive materials for the two electrodes (an anode and a cathode), the OLED is transparent and can emit light on both sides (an anode side and a cathode side) (for example, Japanese Laid-Open Patent Publication No. 2017-3849). However, since the OLED is composed of an organic compound, it is difficult to secure high reliability of the OLED display due to deterioration of the organic compound.

In recent years, a so-called micro LED display device or a mini LED display in which minute LED chips are mounted in pixels of a circuit substrate has been developed for a next-generation display (for example, U.S. Pat. No. 10,090,335). The LED is a self-luminous element similar to the OLED. However, unlike the OLED, the LED is composed of an inorganic compound containing gallium (Ga), indium (In), or the like. Therefore, compared to the OLED display, the micro LED display can easily secure high reliability. Further, the LED has high luminous efficiency and can be made to have high brightness. Therefore, the micro LED display device is expected as the next-generation display having high reliability, high brightness, and high contrast.

SUMMARY

A display device according to an embodiment of the present invention includes a circuit substrate comprising a first electrode pad and an LED chip comprising a first electrode bump that is electrically connected to the first electrode pad, and at least emitting light in a direction of the circuit substrate. The first electrode pad comprises a first light transmission region that transmits light emitted from the LED chip.

DESCRIPTION OF EMBODIMENTS

Figure 1:
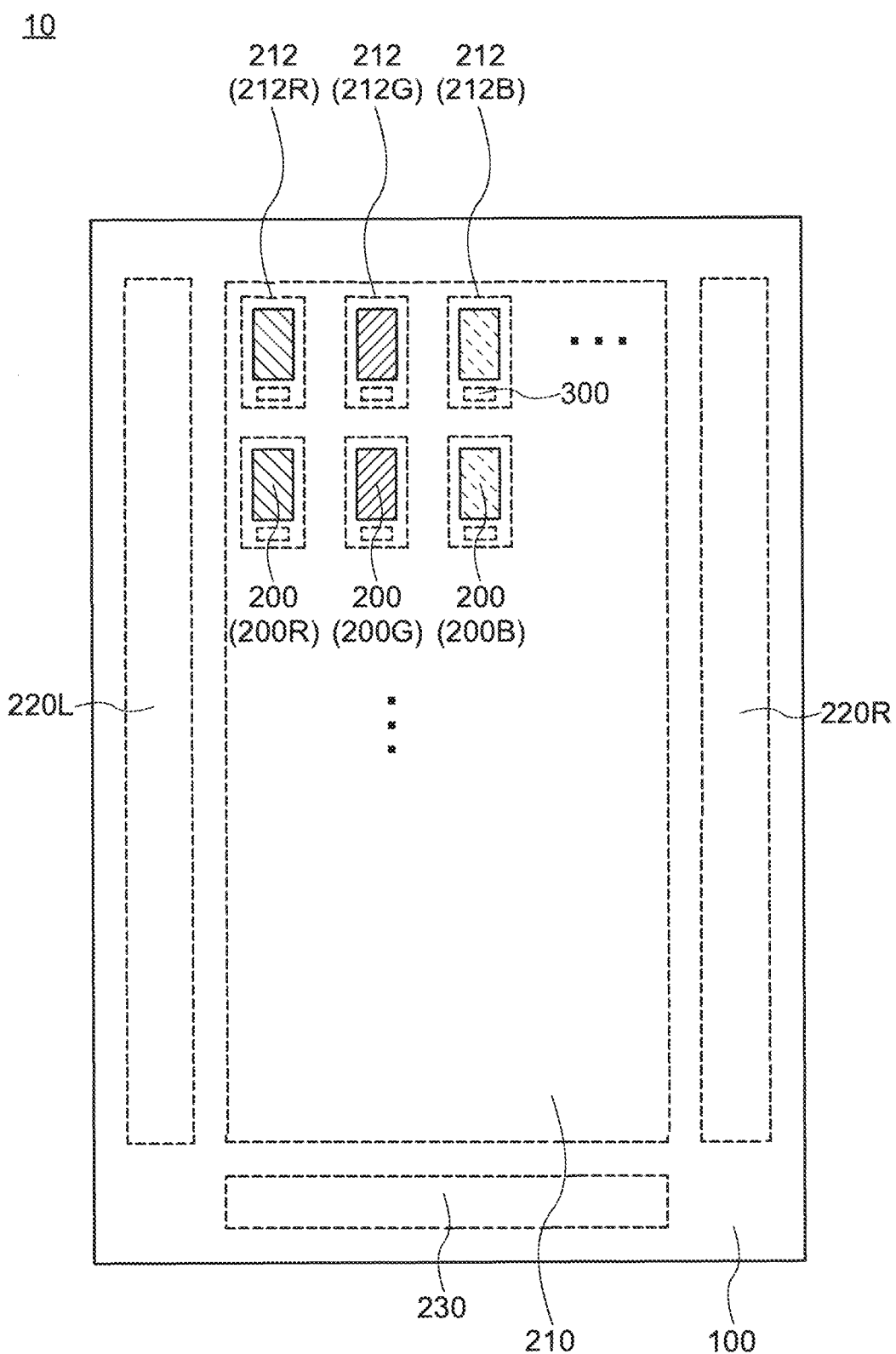
FIG. 1 is a schematic plan view of a display device according to an embodiment of the present invention.

A micro LED display device or a mini LED display device can also be transparent and emit light on both sides by improving an element structure or a mounting structure of the LED chip. However, in the case of the micro LED display device or the mini LED display device, an electrode pad for mounting an LED chip is required over a circuit substrate. Therefore, when light emission of the LED chip is extracted from the circuit substrate side, the light emission of the LED chip is blocked by the electrode pad formed over the circuit substrate. Therefore, there is a problem that light emission efficiency of the LED chip is lowered.

In view of the above problem, it is one object of the an embodiment of the present invention to improve light extraction efficiency from a circuit substrate side in a display device in which LED chips are mounted over the circuit substrate.

Each embodiment of the present inventions is explained below while referring to the drawings. However, each embodiment is only an example and a structure easily arrived at by a person skilled in the art by making appropriate modifications without departing from the concept of the invention is naturally to be contained in the scope of the present invention. In addition, the drawings may be illustrated so that the width, thickness, shape, and the like are illustrated more schematically compared with those of the actual modes in order to provide a clearer explanation. However, they are only an example and do not limit the interpretation of the present invention.

In the specification, expressions such as "a includes A, B, or C", "a includes any of A, B, and C", or "a includes one selected from the group consisting of A, B, and C" do not exclude the case that a includes the combinations of A to C unless otherwise specified. These expressions also do not exclude the case that a includes further other elements.

In the specification, for the convenience of explanation, although an explanation is made using the terms "on" or "over" or "under" or "below", as a general rule, the direction from a substrate to a structure is "on" or "over" with reference to the substrate on which the structure is formed. In contrast, the direction from the structure to the substrate is "under" or "below". Therefore, in the expression "the structure on the substrate", a surface of the structure in the direction facing the substrate is a lower surface of the structure, and an opposite surface is a upper surface of the structure. Further, the expression "the structure on the substrate" merely describes the vertical relationship between the substrate and the structure, and another structure may be arranged between the substrate and the structure. Furthermore, the terms "on" or "over" or "under" or "below" mean the stacking order in a structure in which a plurality of layers are laminated, and may not have a positional relationship of overlapping in a plan view.

In the specification, a "display device" broadly includes a device for displaying an image. The "display device" may include not only a display panel or a display module but also a device to which other optical members (for example, a polarizing member, a backlight, or a touch panel) are attached.

The following embodiments can be combined with each other as long as there is no technical problems.

First Embodiment

<1. Overview of Structure of Display Device>

Referring to FIGS. 1 to 4B, a display device 10 according to an embodiment of the present invention.

FIG. 1 is a schematic plan view of the display device 10 according to the embodiment of the present invention. Specifically, FIG. 1 is a schematic view showing a structure of a plan layout of the display device 10.

As shown in FIG. 1, the display device 10 includes a circuit substrate 100 and a light emitting diode chip (LED chip) 200. The circuit substrate 100 includes a display portion 210, a first circuit portion 220L, a second circuit portion 220R, and a connection portion 230. The display portion 210 is provided in the central portion of the circuit substrate 100. The first circuit portion 220L, the second circuit portion 220R, and the connection portion 230 are provided in the peripheral portion of the circuit substrate 100.

The display portion 210 includes a plurality of pixels 212. An LED chip 200 is mounted in each of the plurality of pixels 212. Further, transistors 300 for controlling the LED chip 200 are provided in each of the plurality of pixels 212.

The LED chip 200 can emit light to at least the circuit substrate 100 side. That is, the light emitted from the LED chip 200 is extracted to the outside through the circuit substrate 100. The LED chip 200 may emit light not only to the circuit substrate 100 side but also to the opposite side of the circuit substrate 100. In this case, the display device 10 is a transparent LED display device capable of emitting light on both sides.

The plurality of LED chips 200 may have different emission colors. That is, in the display device 10, a red LED chip 200R, a green LED chip 200G, and a blue LED chip 200B having different emission colors may be mounted in a red pixel 212R, a green pixel 212G, and a blue pixel 212B, respectively. The display device 10 can perform full-color display by controlling red light emission from the red LED chip 200R, green light emission from the green LED chip 200G, and blue light emission from the blue LED chip 200B.

A size of the LED chip 200 is not particularly limited. The LED chip 200 may be appropriately selected in consideration of the size or resolution of the display device 10. For example, when the display device 10 is a small and medium-sized display device, a mini LED chip or a micro LED chip can be used as the LED chip 200.

In the following, the red LED chip 200R, the green LED chip 200G, and the blue LED chip 200B are described as the LED chip 200 when the emission colors are not particularly distinguished. Similarly, when the pixels are not particularly distinguished, the red pixel 212R, the green pixel 212G, and the blue pixel 212B are described as the pixel 212 when the pixels are not particularly distinguished.

Figure 2:
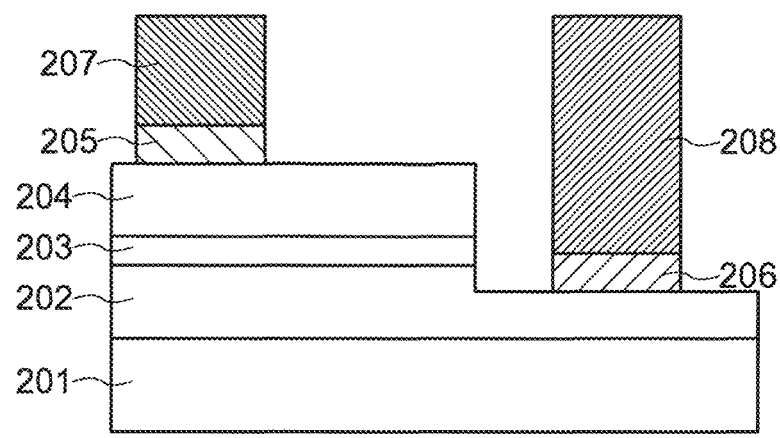
FIG. 2 is a schematic cross-sectional view of an LED chip mounted in a display device according to an embodiment of the present invention.

Referring to FIG. 2, a structure of the LED chip 200 is described. In the display device 10, the LED chip 200 having a horizontal LED structure (horizontal electrode structure) can be used. However, the LED chip 200 is not limited thereto. In the display device 10, an LED chip having a vertical LED structure (vertical electrode structure) may be used.

FIG. 2 is a schematic cross-sectional view of the LED chip 200 mounted in the display device 10 according to the embodiment of the present invention.

As shown in FIG. 2, the LED chip 200 includes a substrate 201, an n-type semiconductor layer 202, a light emitting layer 203, a p-type semiconductor layer 204, a p-type electrode 205, an n-type electrode 206, a first electrode bump 207, and a second electrode bump 208.

The substrate 201 can support each layer provided over the substrate 201. Further, the substrate 201 is preferably a substrate over which the n-type semiconductor layer 202, the light emitting layer 203, and the p-type semiconductor layer 204 can grow crystals. For example, a sapphire substrate, a silicon carbide substrate, a gallium nitride substrate, or the like can be used as the substrate 201.

When the LED chip 200 is the red LED 200R, the light emitting layer 203 of the red LED 200R includes aluminum, gallium, indium, and phosphorus as materials. The composition ratio of aluminum, gallium, and indium is typically aluminum:gallium:indium=0.225:0.275:0.5, but not limited thereto. Further, each of the n-type semiconductor layer 202 and the p-type semiconductor layer is aluminum phosphide indium.

When the LED chip 200 is the green LED 200G, the light emitting layer 203 of the green LED 200G includes indium, gallium, and nitride as materials. The composition ratio of indium and gallium is typically indium:gallium=0.44:0.55, but not limited thereto. Further, each of the n-type semiconductor layer 202 and the p-type semiconductor layer is gallium nitride.

When the LED chip 200 is the blue LED 200B, the light emitting layer 203 of the blue LED 200B includes indium, gallium, and nitride as materials. The composition ratio of indium and gallium is typically indium:allium=0.2:0.8, but not limited thereto. Further, each of the n-type semiconductor layer 202 and the p-type semiconductor layer is gallium nitride.

Aluminum can be used for the p-type electrode 205 and the n-type electrode 206 in any of the red LED 200R, the green LED 200G, and the blue LED 200B, but the p-type electrode 205 and the n-type electrode 206 are not limited to.

The maximum emission wavelengths of the red LED chip 200R, the green LED chip 200G, and the blue LED chip 200B are typically 645 nm, 530 nm, and 450 nm, respectively.

The first electrode bump 207 and the second electrode bump 208 can serve as electrodes not only for connecting to the circuit substrate 100 but also for adjusting a height of the LED chip 200. That is, when a surface of the p-type electrode 205 and a surface of the n-type electrode 206 have different heights, the height of the LED chip 200 can be adjusted using the first electrode bump 207 and the second electrode bump 208. The first electrode bump 207 and the second electrode bump 208 can be formed by plating, sputtering, vapor deposition, printing, or the like. When the first electrode bump 207 and the second electrode bump 208 are formed by plating, for example, gold can be used as a material of the first electrode bump 207 and the second electrode bump 208, but not limited thereto.

In the LED chip 200, the n-type semiconductor layer 202, the light emitting layer 203, and the p-type semiconductor layer 204 are crystal-grown and formed over the substrate 201, and then the p-type electrode 205 and the n-type electrode 206 are formed. Subsequently, the first electrode bump 207 and the second electrode bump 208 are formed on the p-type electrode 205 and the n-type electrode 206, respectively. Finally, the substrate 201 is diced and separated into individual LED chips 200.

The LED chip 200 is not limited to the structure shown in FIG. 2. For example, the p-type electrode 205 and the n-type electrode 206 may be omitted, and the first electrode bump 207 and the second electrode bump 208 may be formed on the p-type semiconductor layer 204 and the n-type semiconductor layer 202, respectively.

Returning to FIG. 1 again, the structure of the display device 10 is described.

The first circuit portion 220L and the second circuit portion 220R include a drive circuit for driving the transistor 300 included in the pixel 212. The drive circuit is, for example, a scanning line drive circuit (gate driver circuit) or a signal line drive circuit (source driver circuit). In FIG. 1, two circuit portions, the first circuit portion 220L and the second circuit portion 220R, are provided, but the number of circuit portions may be one or three or more.

The connection portion 230 is connected to the first circuit portion 220L and the second circuit portion 220R by a connection wiring (not shown). Further, the connection portion 230 is connected to an external device by a flexible printed circuits (FPCs) or the like. That is, signals from the external device is transmitted to the first circuit portion 220L and the second circuit portion 220R through the connection portion 230, and controls the transistors 300 in the pixel 212 of the display portion 210.

Figure 3:
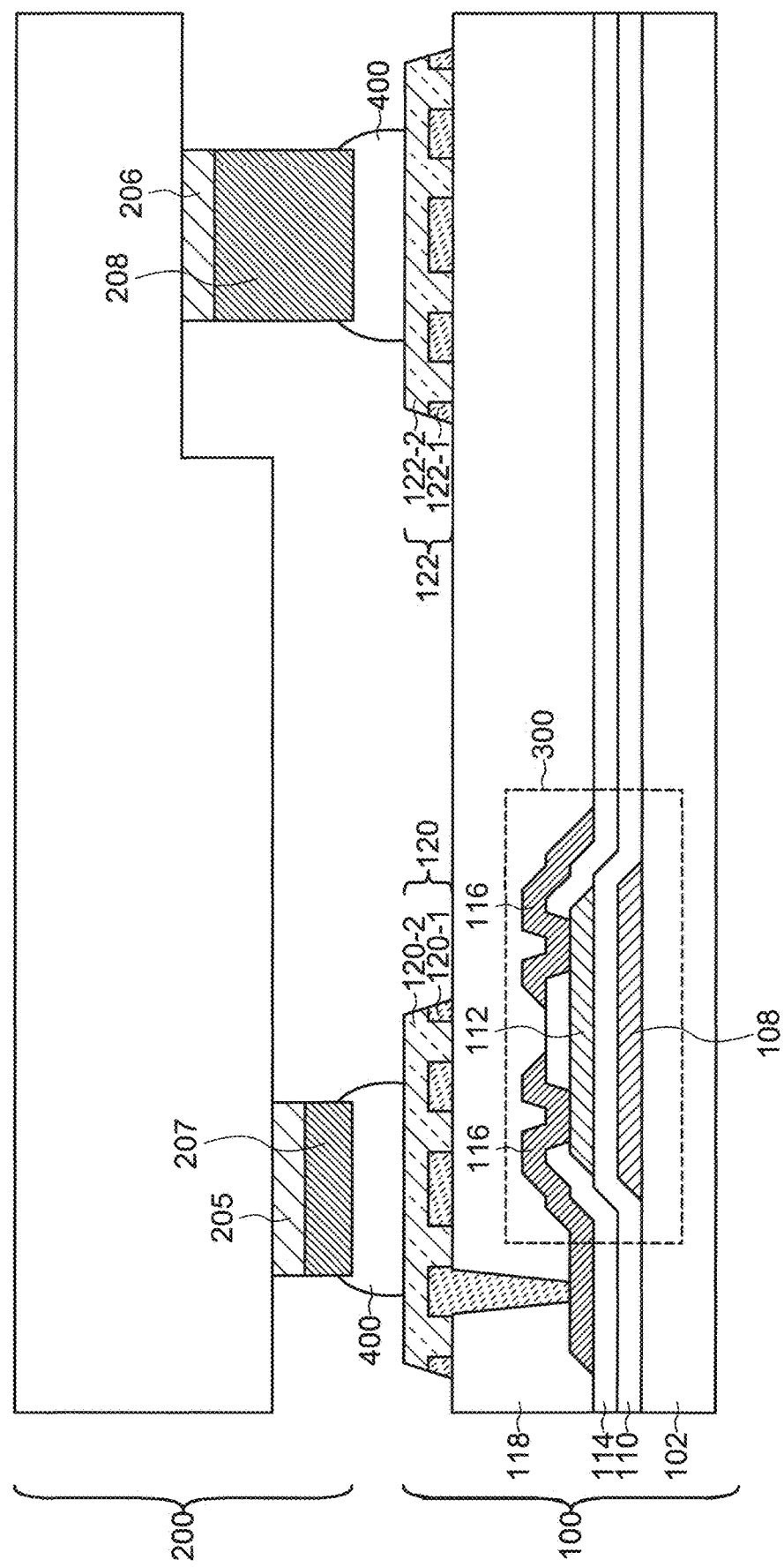
FIG. 3 is a schematic cross-sectional view of a pixel in which an LED chip is mounted, in a display device according to an embodiment of the present invention.

Referring to FIG. 3, a structure of the pixel 212 of the circuit substrate is described.

FIG. 3 is a schematic cross-sectional view of the pixel 212 in which the LED chip 200 is mounted, in the display device 10 according to the embodiment of the present invention.

As shown in FIG. 3, the pixel 212 of the circuit substrate 100 includes a substrate 102, a first wiring layer 108, a first insulating layer 110, a semiconductor layer 112, a second insulating layer 114, a second wiring layer 116, a first planarization layer 118, a first electrode pad 120, and a second electrode pad 122. Further, the LED chip 200 is mounted over the circuit substrate 100 via an adhesive layer 400. That is, a first electrode bump 207 and a second electrode bump 208 of the LED chip 200 are electrically connected to a first electrode pad 120 and a second electrode pad 122, respectively, of the circuit substrate 100 via the adhesive layer 400. In other words, the LED chip 200 is flip-chip bonded onto the circuit substrate 100.

The substrate 102 can support each layer provided over the substrate 102. The substrate 102 may be any substrate that can transmit light emitted from the LED chip 200. For example, a rigid substrate having translucency such as a glass substrate, a quartz substrate, or a sapphire substrate can be used as the substrate 102. Further, a flexible substrate having translucency such as a polyimide resin substrate, an acrylic resin substrate, a siloxane resin substrate, or a fluororesin substrate can be used as the substrate 102. Impurities may be introduced into the above resin substrate in order to improve the heat resistance of the substrate 102. In addition, a substrate in which a silicon oxide film or a silicon nitride film is formed on the rigid substrate or the flexible substrate can be used as the substrate 102.

The first wiring layer 108, the first insulating layer 110, the semiconductor layer 112, the second insulating layer 114, and the second wiring layer 116 can function as a part of the transistor 300. That is, the first wiring layer 108, the first insulating layer 110, the semiconductor layer 112, the second insulating layer 114, and the second wiring layer 116 can function a gate electrode, a gate insulating film, a channel region, an interlayer insulating film, and a source electrode or a drain electrode, respectively.

The transistor 300 shown in FIG. 3 is a bottom gate type transistor. The first insulating layer 110 (gate insulating film) is provided on the first wiring layer 108 (gate electrode). The semiconductor layer 112 (including a channel region) is provided on the first insulating layer 110. The second insulating layer 114 (interlayer insulating film) is provided on the semiconductor layer 112. The second wiring layer 116 (source electrode or drain electrode) is provided on the second insulating layer 114. An opening is provided in the second insulating layer 114, and the second wiring layer 116 is in contact with the semiconductor layer 112 through the opening. One of the second wiring layers 116 in contact with the semiconductor layer 112 can function as the source electrode, and the other of the second wiring layers 116 can function as the drain electrode. The functions of the source electrode and the drain electrode may be interchanged with each other.

A metal material can be used for each of the first wiring layer 108 and the second wiring layer 116. Copper (Cu), aluminum (Al), titanium (Ti), chromium (Cr), cobalt (Co), nickel (Ni), molybdenum (Mo), hafnium (Hf), tantalum (Ta), tungsten (W), or bismuth (Bi), or alloys or compounds thereof can be used as the metal material. Further, these metal materials may be laminated to form the first wiring layer 108 or the second wiring layer 116. The first wiring layer 108 or the second wiring layer 116 can be used not only as a gate electrode, a source electrode, or a drain electrode of the transistor 300, but also as a wiring for connecting between the transistors 300.

An insulating material can be used for each of the first insulating layer 110 and the second insulating layer 114. An inorganic insulating material such as silicon oxide ($SiO_x$), silicon nitride oxide ($SiO_xN_y$), silicon nitride ($SiN_x$), silicon oxynitride ($SiN_xO_y$), aluminum oxide ($AlO_x$), aluminum nitride oxide ($AlO_xN_y$), aluminum oxynitride ($AlN_xO_y$), or aluminum nitride ($AlN_x$) can be used as the insulating material. Here, $SiO_xN_y$ or $AlO_xN_y$ is a silicon compound or an aluminum compound containing nitrogen (N) in an amount smaller than oxygen (O). Further, $SiN_xO_y$ or $AlN_xO_y$ is a silicon compound or an aluminum compound containing oxygen in an amount smaller than that of nitrogen. Further, each of the first insulating layer 110 and the second insulating layer 114 can use not only the inorganic insulating material as described above but also an organic insulating material. For example, a polyimide resin, an acrylic resin, an epoxy resin, a silicone resin, a fluororesin, a siloxane resin, or the like can be used as the organic insulating material. Each of the first insulating layer 110 and the second insulating layer 114 may be a single layer or a stacked layer of the inorganic insulating layer material and the organic insulating material.

A semiconductor material for forming a channel region can be used for the semiconductor layer 112. For example, an oxide semiconductor such as silicon, indium gallium oxide zinc (IGZO) or zinc oxide (ZnO), or a compound semiconductor such as gallium arsenide (GaAs) or gallium nitride (GaN) can be used as the semiconductor material. When the semiconductor material is silicon, it may be amorphous silicon, polysilicon, or single crystal silicon.

Although one transistor 300 is shown in FIG. 3, a plurality of transistors 300 are provided in the pixel 212. Further, the transistor 300 is not limited to the bottom gate type transistor. The transistor 300 may be a top gate type transistor.

The first planarization layer 118 can planarize a structural unevenness of the transistor 300. For example, acrylic resin or polyimide resin can be used as a material of the first planarization layer 118.

Each of the first electrode pad 120 and the second electrode pad 122 can function as an electrode pad that is electrically connected to the LED chip 200. Although the first electrode pad 120 and the transistor 300 are electrically connected to each other in FIG. 3, the second electrode pad 122 and the transistor 300 may be electrically connected to each other.

It is preferable that each of the first electrode pad 120 and the second electrode pad 122 has a stacked structure. That is, the first electrode pad 120 includes a first electrode layer 120-1 and a second electrode layer 120-2, and the second electrode pad 122 includes a third electrode layer 122-1 and a fourth electrode layer 122-2. The stacked structure of each of the first electrode pad 120 and the second electrode pad 122 is not limited to two layers, and may be three or more layers. Further, each of the first electrode layer 120-1 and the third electrode layer 122-1 is provided with a light transmission region that transmits light emitted from the LED chip 200. The details of the stacked structure of the first electrode pad 120 and the second electrode pad 122 and the structure of the light transmission region are described later.

For example, a metal material such as aluminum (Al), copper (Cu), titanium (Ti), molybdenum (Mo), or tungsten (W), or an alloy a compound thereof can be used for each of the first electrode pad 120 and the second electrode pad 122. Further, for example, a transparent conductive material such as indium tin oxide (ITO) or indium zinc oxide (IZO) can be used for each of the first electrode pad 120 and the second electrode pad 122.

When each of the first electrode pad 120 and the second electrode pad 122 has a stacked structure, it is preferable that the second electrode layer 120-2 and the fourth electrode layer 122-2 having transparent conductive materials are provided on the first electrode layer 120-1 and the third electrode layer 122-1 having metal materials, respectively. Since a surface of the metal material are covered with the transparent conductive material, the surface of the metal material can be protected.

The adhesive layer 400 can electrically connect and bond the circuit substrate 100 and the LED chip 200. For example, a conductive adhesive such as silver paste or solder paste can be used as the adhesive layer 400. An anisotropic conductive film (ACF) can also be used as the adhesive layer 400. The anisotropic conductive film (ACF) has an advantage that light emitted from the LED chip 200 easily passes through the first electrode pad 120 and the second electrode pad 122 as compared with silver paste or solder paste. Therefore, it is preferable to use the anisotropic conductive film (ACF) as the adhesive layer 400.

In the display device 10 according to the present embodiment, the light emitted from the LED chip 200 can pass through the first electrode pad 120 and the second electrode pad 122. In the followings, the structures of the first electrode pad 120 and the second electrode pad 122 are described in more detail with reference to FIGS. 4A and 4B.

<2. Structure of First Electrode Pad and Second Electrode Pad>

Figure 4A:
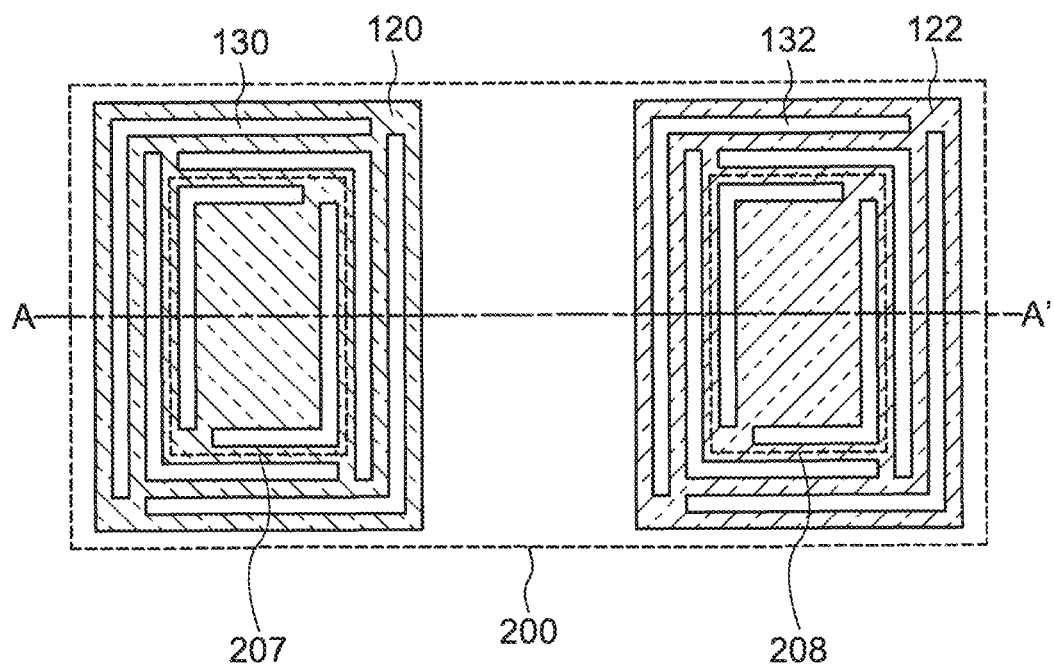
FIG. 4A is a schematic plan view of a first electrode pad and a second electrode pad formed in a circuit substrate, in a display device according to an embodiment of the present invention.

FIG. 4A is a schematic plan view of the first electrode pad 120 and the second electrode pad 122 formed in the circuit substrate 100, in the display device 10 according to the embodiment of the present invention. In FIG. 4A, in order to clarify a positional relationship between the first electrode pad 120 and the second electrode pad 122 and the LED chip 200, the LED chip 200 and the first electrode bump 207 and the second electrode bump 208 formed on the LED chip 200 are shown by the dotted line.

The first electrode pad 120 and the second electrode pad 122 overlap the first electrode bump 207 and the second electrode bump 208, respectively. Further, in a plan view, the first electrode pad 120 is larger than the first electrode bump 207. Similarly, the second electrode pad 122 is larger than the second electrode bump 208. When the LED chip 200 is mounted on the circuit substrate 100, a position of the LED chip 200 may shift. Even in that case, since the first electrode pad 120 and the second electrode pad 122 larger than the first electrode bump 207 and the second electrode bump 208, respectively, the LED chip 200 and the circuit substrate 100 can be electrically connected to each other.

The first electrode pad 120 includes a first light transmission region 130 that transmits light emitted from the LED chip 200. Similarly, the second electrode pad 122 includes a second light transmission region 132 that transmits light emitted from the LED chip 200. Each of the first light transmission region 130 and the second light transmission region 132 is a region in which a plurality of L-shapes are combined. The first electrode pad 120 is a rectangular shape, and the first light transmission region 130 is point-symmetrically provided with respect to a center of the rectangular shape. Similarly, the second electrode pad 122 is a rectangular shape, and the second light transmission region 132 is point-symmetrically provided with respect to a center of the rectangular shape.

The L-shape shown in FIG. 4A is a shape that is bent at a right angle along the outer shape of the first electrode pad 120 or the second electrode pad 122, but is not limited thereto. Further, each of the first light transmission region 130 and the second light transmission region 132 may have a plurality of stripe shapes. Further, each of the first light transmission region 130 and the second light transmission region 132 may have a shape in which not only a straight line but also a curved line is combined. The shape of the first light transmission region 130 and the second light transmission region 132 are not particularly limited as long as the first light transmission region 130 and the second light transmission region 132 can transmit light emitted from the LED chip 200.

Figure 4B:
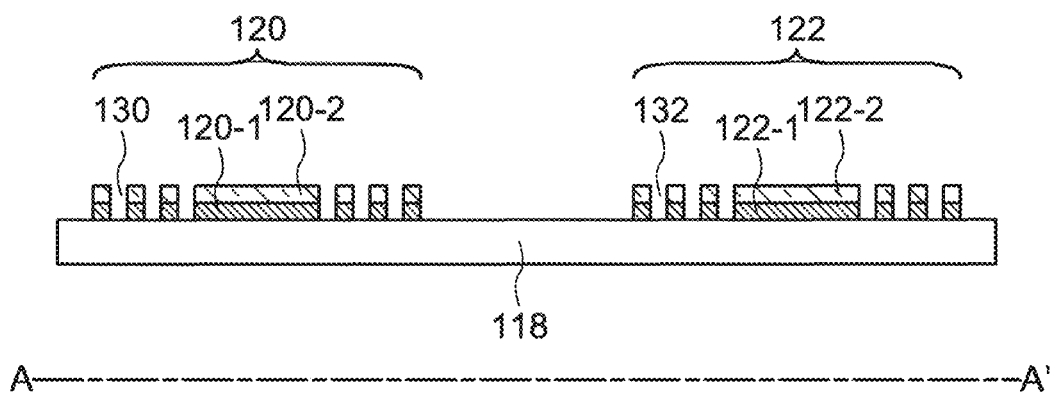
FIG. 4B is a schematic cross-sectional view of a first electrode pad and a second electrode pad formed in a circuit substrate, in a display device according to an embodiment of the present invention.

FIG. 4B is a schematic cross-sectional view of the first electrode pad 120 and the second electrode pad 122 formed in the circuit substrate 100, in the display device 10 according to the embodiment of the present invention. Specifically, FIG. 4B is a cross-sectional view of the first electrode pad 120 and the second electrode pad 122 taken along a line A-A' shown in FIG. 4A.

As shown in FIG. 4B, the first electrode pad 120 and the second electrode pad 122 are formed on the first planarization layer 118. The first electrode pad 120 includes a first electrode layer 120-1 and a second electrode layer 120-2 on the first electrode layer 120-1. Similarly, the second electrode pad 122 includes a third electrode layer 122-1 and a fourth electrode layer 122-2 on the third electrode layer 122-1.

In the first light transmission region 130, the first electrode layer 120-1 and the second electrode layer 120-2 are opened. That is, in the first light transmission region 130, each of the first electrode layer 120-1 and the second electrode layer 120-2 includes an opening portion. Therefore, the light emitted from the LED chip 200 can be transmitted through the first light transmission region 130 without being blocked by the first electrode layer 120-1 and the second electrode layer 120-2. Similarly, since the third electrode layer 122-1 and the fourth electrode layer 122-2 are opened in the second light transmission region 132, the light emitted from the LED chip 200 can pass through the second light transmission region 132.

Since the first electrode pad 120 and the second electrode pad 122 are electrically connected to the first electrode bump 207 and the second electrode bump 208 of the LED chip 200, respectively, it is preferable that potential distributions of the first electrode pad 120 and the second electrode pad 122 are uniform. As described above, the first electrode layer 120-1, the second electrode layer 120-2, the third electrode layer 122-1, and the fourth electrode layer 122-2 are opened in the first light transmission region 130 and the second light transmission region 132. Therefore, if areas of the first light transmission region 130 and the second light transmission region 132 are too large, the potentials of the first electrode pad 120 and the second electrode pad 122 become non-uniform. Therefore, the ratio of the first light transmission region 130 to the first electrode pad 120 is greater than or equal to 5% and less than or equal to 50%, preferably greater than or equal to 10% and less than or equal to 40%, and more preferably greater than or equal to 15% and less than or equal to 30%. Similarly, the ratio of the second light transmission region 132 to the second electrode pad 122 is also greater than or equal to 5% and less than or equal to 50%, preferably greater than or equal to 10% and less than or equal to 40%, and more preferably greater than or equal to 15% and less than or equal to 30%.

In the display device 10 according to the present embodiment, the first electrode pad 120 and the second electrode pad 122 each include a first light transmission region 130 and a second light transmission region 132 that transmit light emitted from the LED chip 200. Therefore, the light emitted from the LED chip 200 can be extracted from the first electrode pad 120 and the second electrode pad 122, so that extraction efficiency of the light emitted from the circuit substrate 100 side in the display device 10 can be improved.

In the followings, some modification examples of structures of the first electrode pad 120 and the second electrode pad 122 are described with reference to FIGS. 5A to 10. The modifications of the display device 10 according to the present embodiment is not limited to the following modification examples.

Modification Example 1

Figure 5A:
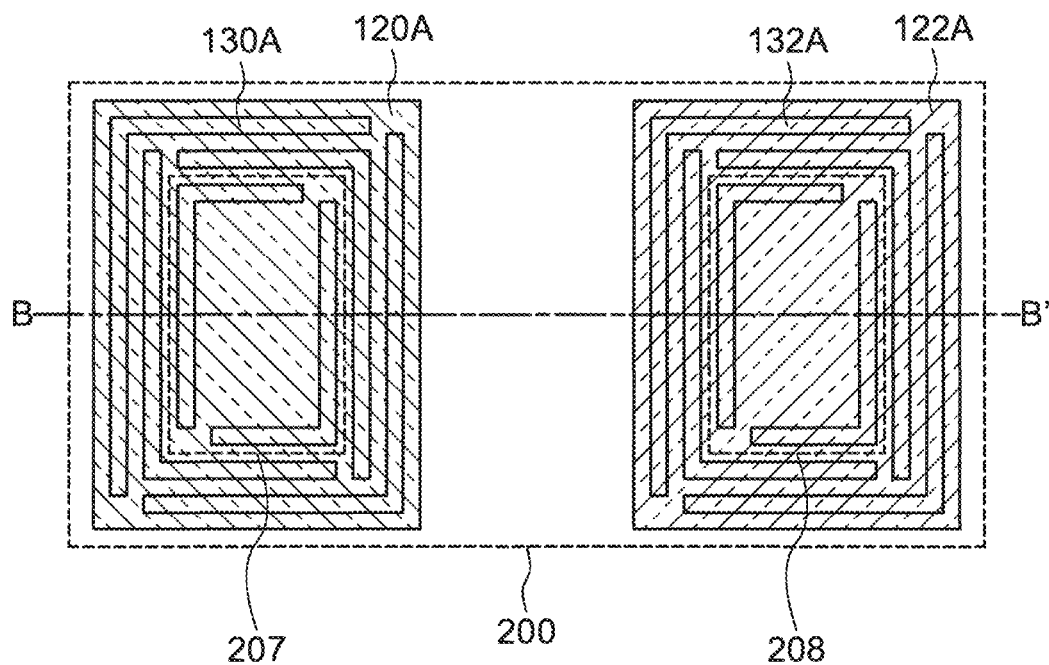
FIG. 5A is a schematic plan view of a first electrode pad and a second electrode pad formed in a circuit substrate, in a display device according to an embodiment of the present invention.
Figure 5B:
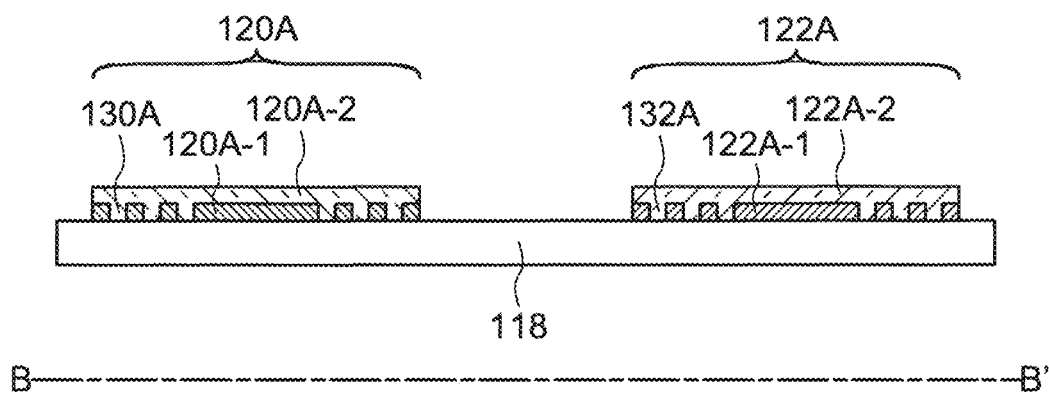
FIG. 5B is a schematic cross-sectional view of a first electrode pad and a second electrode pad formed in a circuit substrate, in a display device according to an embodiment of the present invention.

FIG. 5A is a schematic plan view of a first electrode pad 120A and a second electrode pad 122A formed in the circuit substrate 100, in the display device 10 according to the embodiment of the present invention. Further, FIG. 5B is a schematic cross-sectional view of the first electrode pad 120A and the second electrode pad 122A formed in the circuit substrate 100, in the display device 10 according to the embodiment of the present invention. Specifically, FIG. 5B is a cross-sectional view of the first electrode pad 120A and the second electrode pad 122A taken along a line B-B' shown in FIG. 5A.

As shown in FIG. 5A, the first electrode pad 120A and the second electrode pad 122A include a first light transmission region 130A and a second light transmission region 132A, respectively.

As shown in FIG. 5B, the first electrode pad 120A includes a first electrode layer 120A-1 and a second electrode layer 120A-2. In the first light transmission region 130A, the first electrode layer 120A-1 includes an opening portion, and the second electrode layer 120A-2 is provided so as to cover the opening portion of the first electrode layer 120A-1. Similarly, the second electrode pad 122A includes a third electrode layer 122A-1 and a fourth electrode layer 122A-2. Further, in the second light transmission region 132A, the third electrode layer 122A-1 includes an opening portion, and the fourth electrode layer 122A-2 is provided so as to cover the opening portion of the third electrode layer 122A-1.

Here, the first electrode layer 120A-1 and the third electrode layer 122A-1 are formed of a metal material, and the second electrode layer 120A-2 and the fourth electrode layer 122A-2 are formed of a transparent conductive material. The second electrode layer 120A-2 and the fourth electrode layer 122A-2 are provided in the first light transmission region 130A and the second light transmission region 132A, respectively. However, since the second electrode layer 120A-2 and the fourth electrode layer 122A-2 are transparent conductive materials, the light emitted from the LED chip 200 can transmits the first light transmission region 130A and the second light transmission region 132A.

In the first electrode pad 120A and the second electrode pad 122A of the display device 10 according to the modification example, the light transmission region 130A and the second light transmission region 132A which transmit the light emitted from the LED chip 200 are provided, respectively. Further, transparent conductive materials are provided on the entire surfaces of the first electrode pad 120A and the second electrode pad 122A. Therefore, in the display device 10, extraction efficiency of the light emitted from the circuit substrate 100 side can be improved, and the potentials of the first electrode pad 120A and the second electrode pad 122A can also be uniform.

Modification Example 2

Figure 6:
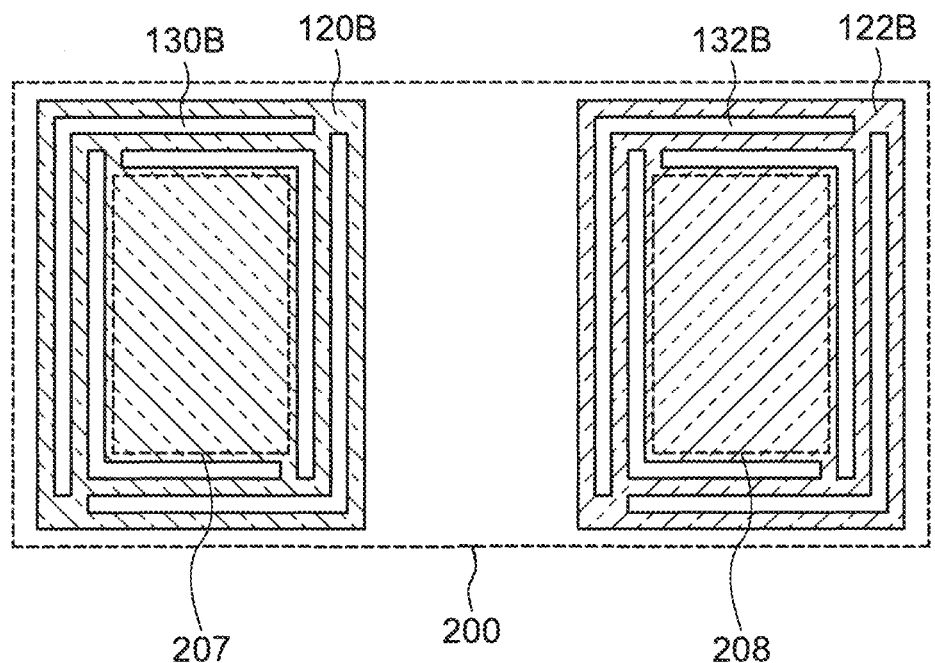
FIG. 6 is a schematic plan view of a first electrode pad and a second electrode pad formed in a circuit substrate, in a display device according to an embodiment of the present invention.

FIG. 6 is a schematic plan view of a first electrode pad 120B and a second electrode pad 120B formed in the circuit substrate 100, in the display device 10 according to the embodiment of the present invention.

As shown in FIG. 6, the first electrode pad 120B and the second electrode pad 122B include a first light transmission region 130B and a second light transmission region 132B, respectively. Since cross-sectional structures of the first light transmission region 130B and the second light transmission region 132B are the same as those of the first light transmission region 130 and the second light transmission region 132 described above, the description thereof is omitted.

Each of the first light transmission region 130B and the second light transmission region 132B includes a region in which a plurality of L-shapes is provided, but the plurality of L-shape is not provided in a region which overlaps the first electrode bump 207 and the second electrode bump 208. That is, the first light transmission region 130B and the second light transmission region 132B do not overlap the first electrode bump 207 and the second electrode bump 208, respectively.

In the first electrode pad 120B and the second electrode pad 122B of the display device 10 according to the modification example, the light transmission region 130B and the second light transmission region 132B which transmit the light emitted from the LED chip 200 are provided, respectively. However, Since the first light transmission region 130B and the second light transmission region 132B are not provided in the regions overlapping the first electrode bump 207 and the second electrode bump 208, the regions overlapping the first electrode bump 207 and the second electrode bump 208 have flat surfaces. Therefore, since the first electrode bump 207 and the second electrode bump 208 of the LED chip 200 are adhered to the flat surfaces of the first electrode pad 120B and the second electrode pad 122B of the circuit substrate 100, the adhesive strength between the LED chip 200 and the circuit substrate 100 can be improved. Further, the first light transmission region 130B and the second light transmission region 132B can improve extraction efficiency of the light emitted from the circuit substrate 100 side.

Modification Example 3

Figure 7:
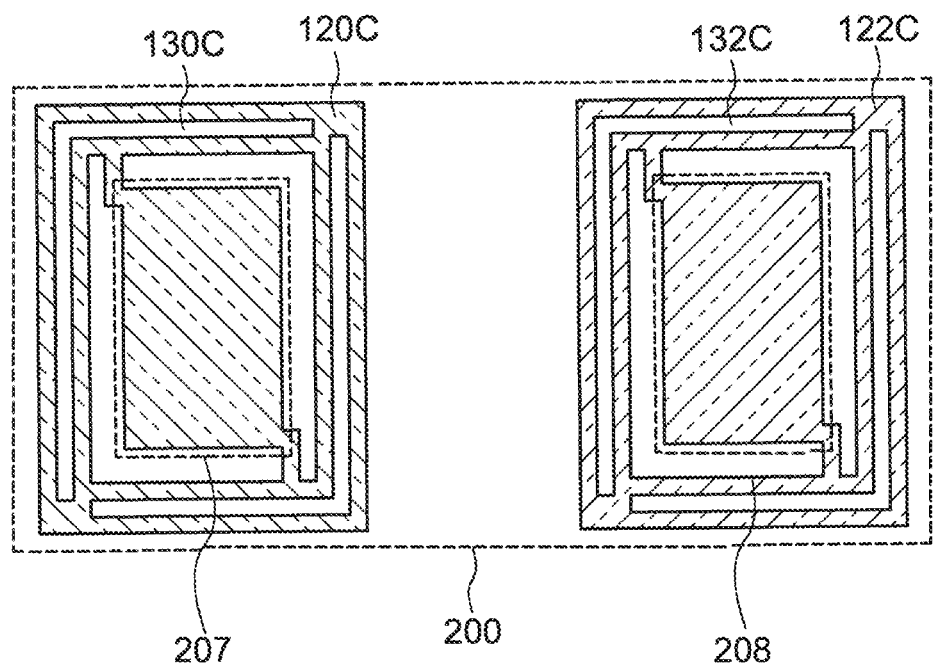
FIG. 7 is a schematic plan view of a first electrode pad and a second electrode pad formed in a circuit substrate, in a display device according to an embodiment of the present invention.

FIG. 7 is a schematic plan view of a first electrode pad 120C and a second electrode pad 122C formed in the circuit substrate 100, in the display device 10 according to the embodiment of the present invention.

As shown in FIG. 7, the first electrode pad 120C and the second electrode pad 122C include a first light transmission region 130C and a second light transmission region 132C, respectively. Since cross-sectional structures of the first light transmission region 130C and the second light transmission region 132C are the same as those of the first light transmission region 130 and the second light transmission region 132 described above, the description thereof is omitted.

Each of the first light transmission region 130C and the second light transmission region 132C includes a plurality of L-shaped regions, but a part of the plurality of L-shaped regions overlaps ends of the first electrode bump 207 and the second electrode bump 208.

In the first electrode pad 120C and the second electrode pad 122C of the display device 10 according to the modification example, the light transmission region 130C and the second light transmission region 132C which transmit the light emitted from the LED chip 200 are provided, respectively. Further, a part of the first light transmission region 130C and a part of the second light transmission region 132C overlap the first electrode bump 207 and the second electrode bump 208, respectively. Since the first light transmission region 130C and the second light transmission region 132C include recessed portions, the conductive adhesive protruding from the first electrode bump 207 and the second electrode bump 208 can be applied to the recessed portions. Furthermore, the first light transmission region 130C and the second light transmission region 132C can improve extraction efficiency of the light emitted from the circuit substrate 100 side.

Modification Example 4

Figure 8:
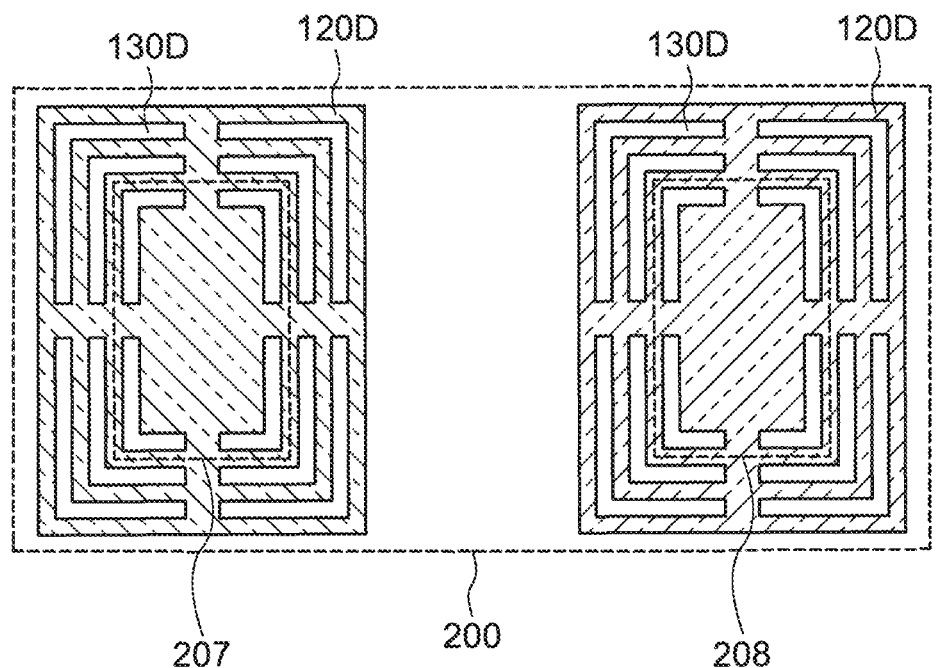
FIG. 8 is a schematic plan view of a first electrode pad and a second electrode pad formed in a circuit substrate, in a display device according to an embodiment of the present invention.

FIG. 8 is a schematic plan view of a first electrode pad 120D and a second electrode pad 122D formed in the circuit substrate 10, in the display device 10 according to the embodiment of the present invention.

As shown in FIG. 8, the first electrode pad 120D and the second electrode pad 122D include a first light transmission region 130D and a second light transmission region 132D, respectively. Since cross-sectional structures of the first light transmission region 130D and the second light transmission region 132D are the same as those of the first light transmission region 130 and the second light transmission region 132 described above, the description thereof is omitted.

Each of the first light transmission region 130D and the second light transmission region 132D includes a plurality of L-shaped regions. The first electrode pad 120D is a rectangular shape, and the first light transmission region 130D is symmetrically provided with a straight line connecting midpoints of two opposite sides of the rectangular shape as an axis of symmetry.

In the first electrode pad 120D and the second electrode pad 122D of the display device 10 according to the modification example, the light transmission region 130D and the second light transmission region 132D are provided in the highly symmetric shape. Therefore, potentials of the first electrode pad 120D and the second electrode pad 122D can be uniform. Further, the first light transmission region 130D and the second light transmission region 132D can improve extraction efficiency of the light emitted from the circuit substrate 100 side.

Modification Example 5

Figure 9:
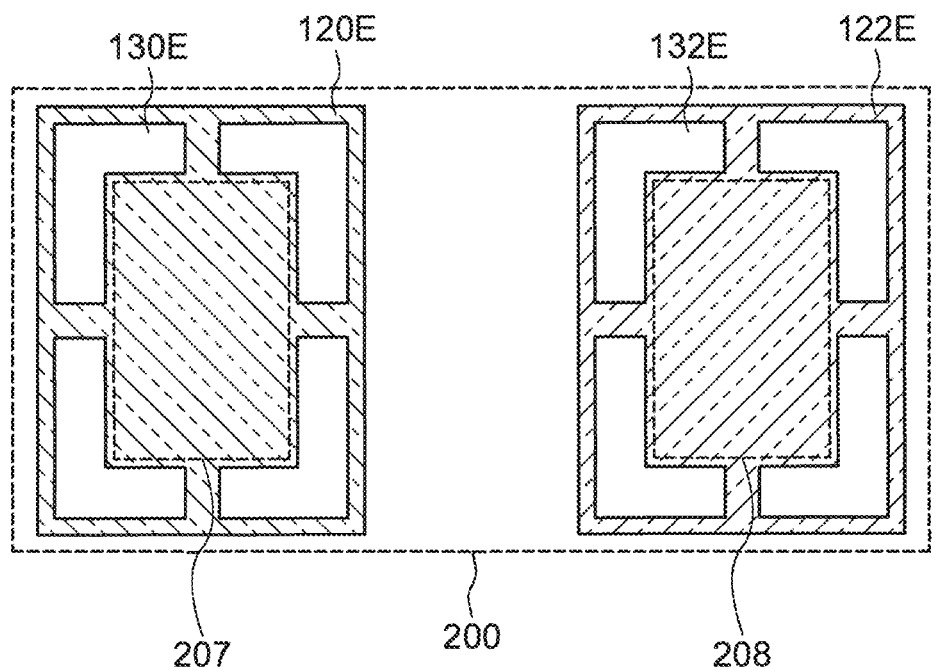
FIG. 9 is a schematic plan view of a first electrode pad and a second electrode pad formed in a circuit substrate, in a display device according to an embodiment of the present invention.

FIG. 9 is a schematic plan view of a first electrode pad 120E and a second electrode pad 122E formed in the circuit substrate 100, in the display device 10 according to the embodiment of the present invention.

As shown in FIG. 9, the first electrode pad 120E and the second electrode pad 122E include a first light transmission region 130E and a second light transmission region 132E, respectively. Since cross-sectional structures of the first light transmission region 130E and the second light transmission region 132E are the same as those of the first light transmission region 130 and the second light transmission region 132 described above, the description thereof is omitted.

Each of the first light transmission region 130E and the second light transmission region 132E includes a plurality of L-shaped regions. The first light transmission region 130E is provided in a region which does not overlap the first electrode bump 207 so as to occupy a large proportion of the first electrode pad 120E. Similarly, the second light transmission region 132E is provided in a region which does not overlap the second electrode bump 208 so as to occupy a large proportion of the second electrode pad 122E.

The ratio of the first light transmission region 130E to the first electrode pad 120E is greater than or equal to 50% and less than or equal to 90%, preferably greater than or equal to 55% and less than or equal to 85%, and more preferably greater than or equal to 60% and less than or equal to 80%. Similarly, the ratio of the second light transmission region 132E to the second electrode pad 122E is greater than or equal to 50% and less than or equal to 90%, preferably greater than or equal to 55% and less than or equal to 85%, and more preferably greater than or equal to 60% and less than or equal to 80%.

In the first electrode pad 120E and the second electrode pad 122E of the display device 10 according to the modification example, the light transmission region 130E and the second light transmission region 132E which transmit the light emitted from the LED chip 200 are provided, respectively. However, since the first light transmission region 130E and the second light transmission region 132E are not provided in the regions which overlap the first electrode bump 207 and the second electrode bump 208, the regions which overlap the first electrode bump 207 and the second electrode bump 208 have flat surfaces. Therefore, since the first electrode bump 207 and the second electrode bump 208 of the LED chip 200 are adhered to the flat surfaces of the first electrode pad 120E and the second electrode pad 122E of the circuit substrate 100, the adhesive strength between the LED chip 200 and the circuit substrate 100 can be improved. Further, since the ratios of the first light transmission region 130E to the first electrode pad 120E and the second light transmission region 132E to the second electrode pad 122E are large, extraction efficiency of the light emitted from the circuit substrate 100 side can be further improved.

Modification Example 6

Figure 10:
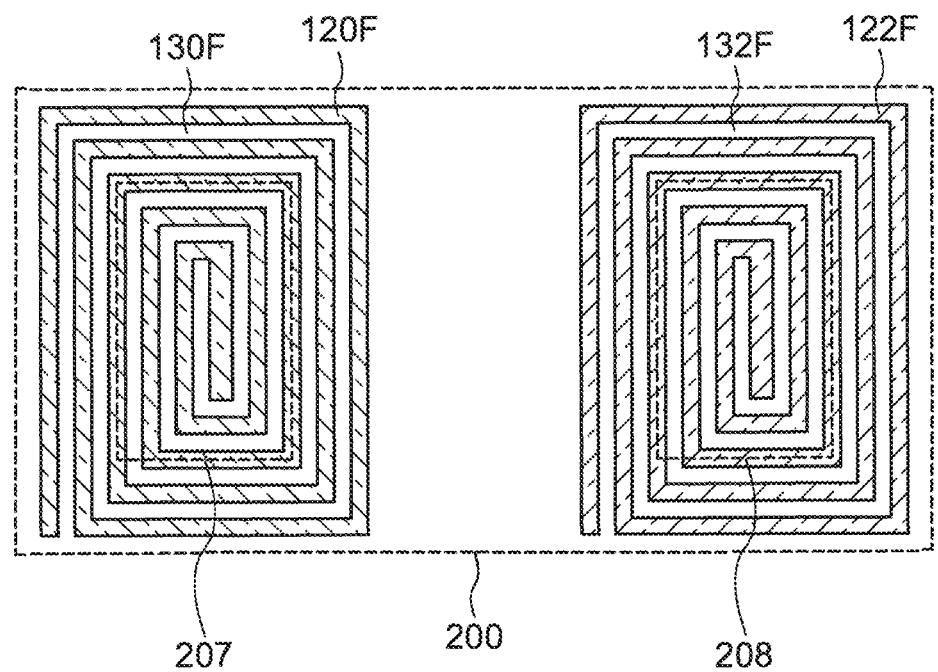
FIG. 10 is a schematic plan view of a first electrode pad and a second electrode pad formed in a circuit substrate, in a display device according to an embodiment of the present invention.

FIG. 10 is a schematic plan view of a first electrode pad 120F and a second electrode pad formed in the circuit substrate 100, in the display device 10 according to the embodiment of the present invention.

As shown in FIG. 10, the first electrode pad 120F and the second electrode pad 122F include a first light transmission region 130F and a second light transmission region 132F, respectively. Since cross-sectional structures of the first light transmission region 130F and the second light transmission region 132F are the same as those of the first light transmission region 130 and the second light transmission region 132 described above, the description thereof is omitted.

Each of the first light transmission region 130F and the second light transmission region 132F is provided in a spiral shape along ends of the first electrode pad 120F and the second electrode pad 122F, respectively.

In the first electrode pad 120F and the second electrode pad 122F of the display device 10 according to the modification example, the light transmission region 130F and the second light transmission region 132F which transmit the light emitted from the LED chip 200 are provided, respectively. In regions which overlaps with the first electrode bump 207 and the second electrode bump 208, potentials of the regions can be uniform by selectively filling recessed portions of the first light transmission region 130F and the second light transmission region 132F with a conductive adhesive. Further, in regions which do not overlap the first electrode bump 207 and the second electrode bump 208, the first light transmission region 130F and the second light transmission region 132F can improve extraction efficiency of the light emitted from the circuit substrate 100 side.

Second Embodiment

Figure 11:
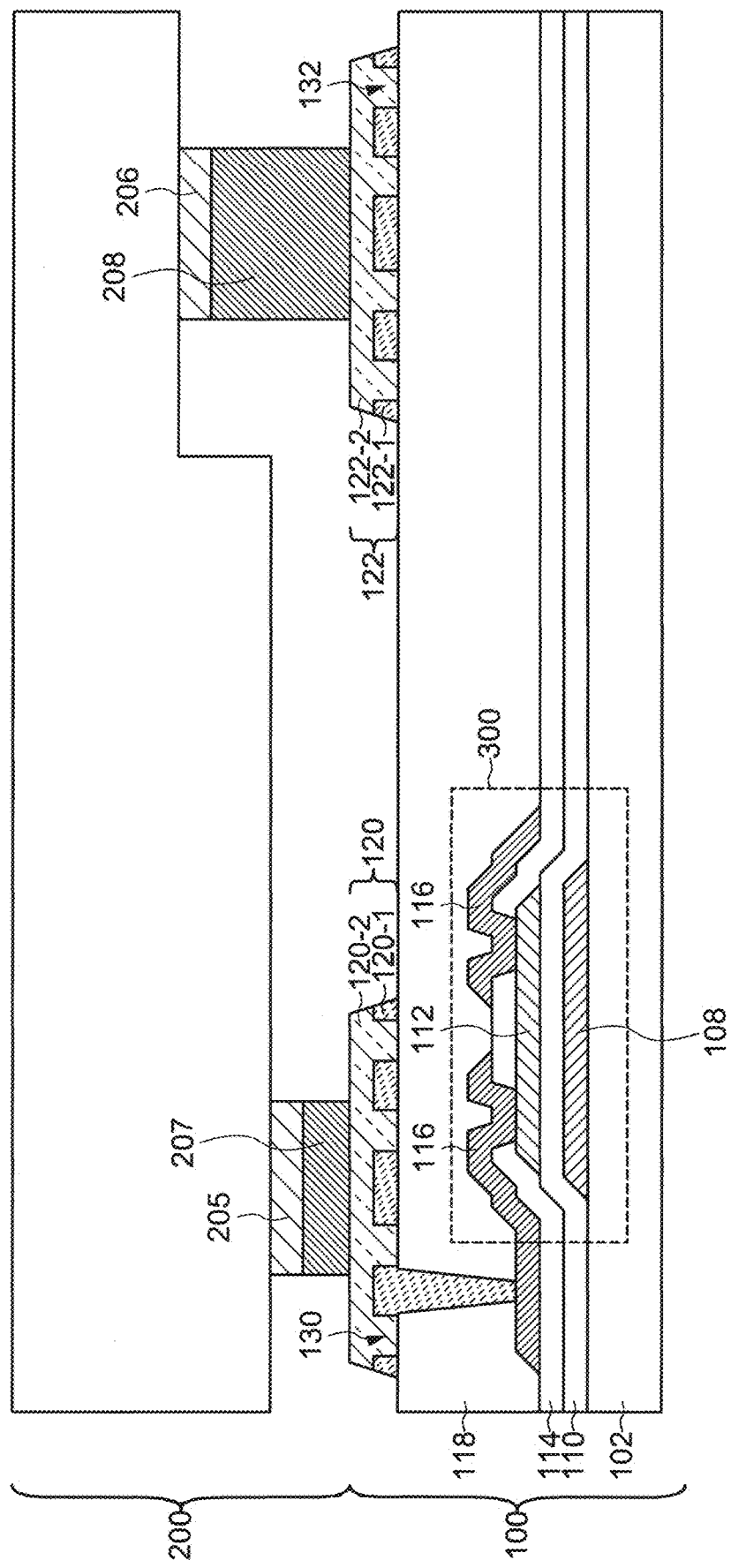
FIG. 11 is a schematic cross-sectional view of a pixel in which an LED chip is mounted, in a display device according to an embodiment of the present invention.

Referring to FIG. 11, a structure of a pixel 212a of a display device 10a according to an embodiment of the present invention.

FIG. 11 is a schematic cross-sectional view of the pixel 212a in which the LED chip 200 is mounted, in the display device 10a according to the embodiment of the present invention.

In the pixel 202a, since the structures of the circuit substrate 100 and the LED chip 200 are the same as those in the First Embodiment, the description thereof is omitted.

The first electrode bump 207 and the second electrode bump 208 of the LED chip 200 is in direct contact with and electrically connected to the first electrode pad 120 and the second electrode pad 122 of the circuit substrate 100, respectively. That is, the circuit substrate 100 and the LED chip 200 are directly bonded to each other without using a conductive adhesive. As a method of direct bonding, for example, a method of ultrasonic waves or thermocompression bonding can be used.

In the display device 10a according to the present embodiment, the circuit substrate 100 and the LED chip 200 are bonded to each other without using the conductive adhesive. The first light transmission region 130 and the second light transmission region 132 are not blocked by the conductive adhesive. Therefore, since the light emitted from the LED chip 200 is extracted from the first light transmission region 130 and the second light transmission region 132, extraction efficiency of the light from the circuit substrate 100 side can be improved.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:
1. A display device comprising:
a circuit substrate comprising a first electrode pad; and
an LED chip comprising a first electrode bump that is electrically connected to the first electrode pad, and at least emitting light in a direction of the circuit substrate,
wherein the first electrode pad comprises a first light transmission region that transmits light emitted from the LED chip,
wherein the first electrode pad comprises a first electrode layer,
wherein the first electrode layer comprises a metal material, and
wherein the first electrode layer comprises an opening portion in the first light transmission region.
2. The display device according to claim 1, wherein the first electrode pad and the first electrode bump are electrically connected to each other through a conductive adhesive.

3. The display device according to claim 1, wherein the first electrode pad and the first electrode bump are electrically connected to each other through an anisotropic conductive film.

4. The display device according to claim 1, wherein the circuit substrate further comprises a second electrode pad,
wherein the LED chip further comprises a second bump that is electrically the second electrode pad, and
wherein the second electrode pad and the second electrode bump are in direct contact with each other and electrically connected each other.

5. The display device according to claim 1,
wherein the circuit substrate further comprises a second electrode pad,
wherein the LED chip further comprises a second bump that is electrically the second electrode pad, and
wherein the second electrode pad comprises a second light transmission region that transmits light emitted from the LED chip.

6. The display device according to claim 1, wherein a ratio of the first light transmission region to the first electrode pad is greater than or equal to 15% and less than or equal to 30%.

7. The display device according to claim 1, wherein the first light transmission region does not overlap the first electrode bump.

8. The display device according to claim 1, wherein the first light transmission region overlaps an end portion of the first electrode bump.

9. The display device according to claim 1,
wherein the first electrode pad further comprises a second electrode layer over the first electrode layer,
wherein the second electrode layer comprises a transparent material.

10. The display device according to claim 9, wherein each of the first electrode layer and the second electrode layer is opened in the first light transmission region.

11. The display device according to claim 9,
wherein the second electrode layer is provided so as to cover the opening portion.

12. The display device according to claim 1,
wherein the first electrode pad is a rectangular shape, and
wherein the first light transmission region is point-symmetrically provided with respect to a center of the rectangular shape.

13. The display device according to claim 1,
wherein the first electrode pad is a rectangular shape, and
wherein the first light transmission region is symmetrically provided with a straight line connecting midpoints of two opposite sides of the rectangle shape as an axis of symmetry.

* * * * *